United States Patent [19]
Lee et al.

[11] Patent Number: 5,856,688
[45] Date of Patent: Jan. 5, 1999

[54] INTEGRATED CIRCUIT MEMORY DEVICES HAVING NONVOLATILE SINGLE TRANSISTOR UNIT CELLS THEREIN

[75] Inventors: Keun-Ho Lee; Chang-Hoon Choi, both of Seoul, Rep. of Korea

[73] Assignee: Samsung Electronics Co., Ltd., Suwon, Rep. of Korea

[21] Appl. No.: 941,771

[22] Filed: Sep. 30, 1997

[30] Foreign Application Priority Data

May 9, 1997 [KR] Rep. of Korea ................... 1997-17809

[51] Int. Cl.⁶ .......................... H01L 29/76; H01L 29/94; H01L 31/062; H01L 31/113
[52] U.S. Cl. ........................................... 257/295; 257/316
[58] Field of Search ................................... 257/296, 316, 257/315, 295

[56] References Cited

U.S. PATENT DOCUMENTS

| | | | |
|---|---|---|---|
| 5,365,094 | 11/1994 | Takasu . | |
| 5,412,596 | 5/1995 | Hoshiba | 365/145 |
| 5,436,490 | 7/1995 | Nakamura | 257/410 |
| 5,446,688 | 8/1995 | Torimaru | 365/145 |
| 5,498,888 | 3/1996 | Ozawa . | |
| 5,515,311 | 5/1996 | Mihara | 365/145 |
| 5,517,445 | 5/1996 | Imai et al. | 365/145 |
| 5,541,871 | 7/1996 | Nishimura et al. | 365/145 |
| 5,604,357 | 2/1997 | Hori | 257/24 |
| 5,621,681 | 4/1997 | Moon | 365/145 |
| 5,623,439 | 4/1997 | Gotoh et al. . | |
| 5,640,345 | 6/1997 | Okuda et al. | 365/184 |
| 5,753,966 | 5/1998 | Naiki et al. . | |

OTHER PUBLICATIONS

Hiroshi Shiwra et al., *Proposal of a Single–Transistor–Type Ferroelectric Memory Using an SOI Structure and Experimental Study on Interference Problem in Write Operation*; Extended Abstracts of the 1996 International Conference on Solid State Devices and Materials, Sympo.II–8, Yokohama, 1996, pp. 809–811.

Yuichi Nakao et al., *Study on Ferroelectric Thin Films for Application to NDRO Non–volatile Memories*, Integrated Ferroelectrics, 1995, vol. 6, pp. 23–24.

N. Tanabe et al., *A Ferroelectric Capacitor Over Bit–Line (F–COB) Cell For High Density Nonvolatile Ferroelectric Memories*, 1995 Symposium on VLSI Technology Digest of Technical Papers, pp. 123–124.

Shigeo Onishi et al., *A Half–Micron Ferroelectric Memory Cell Technology With Stacked Capacitor Structure*, 1994 IEEE, IEDM, 34.4.1–34.4.4, pp. 843–846.

*Primary Examiner*—Stephen D. Meier
*Attorney, Agent, or Firm*—Myers Bigel Sibley & Sajovec

[57] ABSTRACT

Integrated circuit memory devices include a gate oxide insulating layer on a surface of a semiconductor substrate containing a bulk region of first conductivity type and spaced source and drain regions of second conductivity type therein extending to the surface. First and second separate control gates are also preferably provided in each unit cell and extend opposite the surface. A ferroelectric insulating layer is provided between the first and second control gates and acts as a nonvolatile data storage medium when it is polarized in a predetermined state. A floating gate is also provided having a preferred C-shape when viewed in transverse cross-section. In particular, the floating gate is provided to have a first extension disposed between the first control gate and the first electrically insulating layer and a second extension disposed between the first control gate and the ferroelectric insulating layer. The first control gate is also electrically insulated from the floating gate by a second electrically insulating layer disposed between the first control gate and the first extension and a third electrically insulating layer disposed between the first control gate and the second extension. According to a preferred aspect of the present invention, the thickness of the second electrically insulating is greater than a thickness of the third electrically insulating layer, however, the dielectric constant of the third electrically insulating layer is preferably greater than the dielectric constant of the second electrically insulating layer.

11 Claims, 5 Drawing Sheets

INTEGRATED CIRCUIT MEMORY DEVICES HAVING NONVOLATILE SINGLE TRANSISTOR UNIT CELLS THEREIN

FIELD OF THE INVENTION

The present invention relates to integrated circuit devices and more particularly to integrated circuit memory devices and methods of operating same.

BACKGROUND OF THE INVENTION

Random access memory (RAM) devices containing ferroelectric regions therein that can be polarized to provide nonvolatile data storage are typically referred to a ferroelectric random access memory (FRAM) devices. FRAM devices possess certain unique advantages over many conventional memory devices because they typically have high read/write operating speed, retain data in a nonvolatile state and have high reliability and durability. One such FRAM device having ferroelectric transistor (FT) unit cells therein is disclosed in U.S. Pat. No. 5,412,596 to Hoshiba, entitled *Semiconductor Storage Device With A Ferroelectric Transistor Storage Cell.* However, to prevent inadvertent read operations when a FT is programmed into a normally-on state, a switching transistor (ST) is also provided in each unit cell, in series with each FT. Unfortunately, the addition of a switching transistor to prevent inadvertent read operations increases the unit cell size and reduces the integration density of the memory device. To address this problem, U.S. Pat. No. 5,541,871 to Nishimura et al. entitled *Nonvolatile Ferroelectric-Semiconductor Memory*, discloses a single ferroelectric transistor unit cell having a control gate (CG) and a memory gate (MG) disposed opposite a channel region 26.

Notwithstanding these attempts to develop improved FRAM devices, there continues to be a need for improved memory devices which are reliable, can be read nondestructively and have reduced unit cell size.

SUMMARY OF THE INVENTION

It is therefore an object of the present invention to provide integrated circuit memory devices containing single-transistor nonvolatile unit cells therein and methods of operating same.

It is another object of the present invention to provide integrated circuit memory devices having reduced unit cell size and methods of operating same.

It is still another object of the present invention to provide integrated circuit memory devices that can be read nondestructively and methods of operating same.

These and other objects, advantages and features of the present invention are provided by integrated circuit memory devices having nonvolatile unit cells therein that contain a single ferroelectric-based transistor to store logic data therein. First and second control gates and a preferred C-shape floating gate electrode having first and second extensions on opposite sides of the first control gate are also provided to eliminate the need for an additional select/access transistor.

According to a preferred embodiment of the present invention, a nonvolatile memory device is provided which comprises a gate oxide insulating layer on a surface of a semiconductor substrate containing a bulk region of first conductivity type and spaced source and drain regions of second conductivity type therein extending to the surface. First and second separate control gates are also preferably provided in each unit cell and extend opposite the surface. A ferroelectric insulating layer is provided between the first and second control gates and acts as a nonvolatile data storage medium when it is polarized in a predetermined state. A floating gate is also provided having a preferred C-shape when viewed in transverse cross-section. In particular, the floating gate is provided to have a first extension disposed between the first control gate and the first electrically insulating layer and a second extension disposed between the first control gate and the ferroelectric insulating layer. The first control gate is also electrically insulated from the floating gate by a second electrically insulating layer disposed between the first control gate and the first extension and a third electrically insulating layer disposed between the first control gate and the second extension. According to a preferred aspect of the present invention, the thickness of the second electrically insulating is greater than a thickness of the third electrically insulating layer, however, the dielectric constant of the third electrically insulating layer is preferably greater than the dielectric constant of the second electrically insulating layer.

Preferred methods of operating the above described memory devices include the steps of writing first data (e.g., logic 1) into the memory device by establishing a first potential ($V_{prog}$) across the first and second control gates to polarize the ferroelectric insulating layer in a first polarized state and then reading the first data by applying a second potential ($V_{read}$) across the first and second control gates to establish an inversion layer channel in the semiconductor substrate. Here, the second potential is less than the first potential and is insufficient to cause polarization reversal in the ferroelectric insulating layer so that a nondestructive read operation can be performed. Preferred methods also include the steps of writing second data (e.g., logic 0) into the memory device by establishing a fourth potential (e.g., $-V_{prog}$), opposite the first potential, across the first and second control gates to polarize the ferroelectric insulating layer in a second polarized state and then reading the second data by applying the second potential ($V_{read}$) across the first and second control gates and applying a third potential to a bit line that is coupled to a drain region of the memory device.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types. Like numbers refer to like elements throughout.

Figure 1:
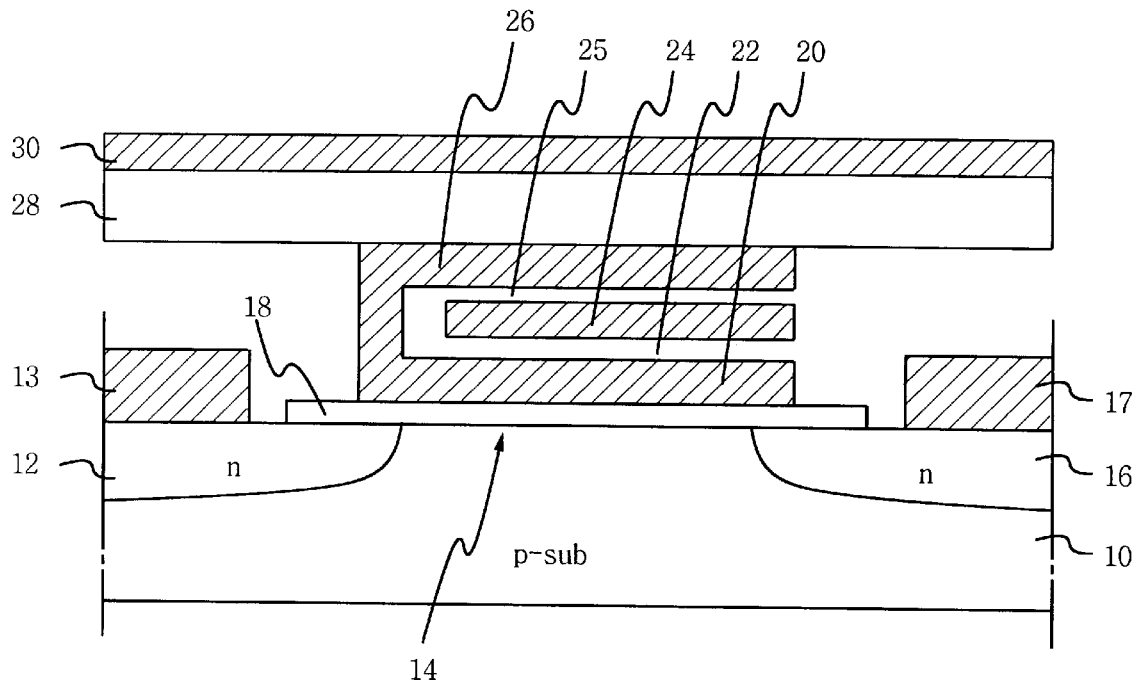
FIG. 1 is a cross-sectional view of a nonvolatile memory device according to a first embodiment of the present invention.

Referring now to FIG. 1, a nonvolatile memory device (e.g., unit cell) according to a first embodiment of the present invention will be described. In particular, FIG. 1 illustrates a semiconductor substrate 10 containing a semiconductor region of first conductivity type (e.g., P-type) therein extending to a surface thereof. Spaced source and drain regions 12 and 16 of second conductivity type (e.g., N-type) are also provided in the substrate 10 and define a channel region 14 of first conductivity type therebetween. Direct electrical contact to the source and drain regions 12 and 16 is also provided by source and drain electrodes 13 and 17 on the surface of the substrate 10. A first electrically insulating layer 18 is also provided on the surface of the substrate 10, opposite the channel region 14 of first conductivity type. According to a preferred aspect of the present invention, first and second separate control gates (e.g., CG1 and CG2) 24 and 30 are provided on the substrate 10, opposite the surface. A ferroelectric insulating layer 28 having a thickness of about 2500 Å is also provided on the substrate 10 to act as a medium for storing data according to a polarization state. As illustrated, the ferroelectric insulating layer 28 is disposed between the first and second control gates 24 and 30.

In addition, a floating gate having a generally C-shaped cross section is provided on the substrate 10. The floating gate includes a first extension 20 which is disposed between the first control gate 24 and the first electrically insulating layer 18 and a second extension 26 which is disposed between the ferroelectric insulating layer 28 and the first control gate 24. The first and second extensions 20 and 26 may be formed using respective layers of metallization which are electrically connected together during fabrication. Second and third electrically insulating layers 22 and 25 are also provided to electrically insulate the first control gate 24 from the floating gate. To obtain preferred electrical characteristics, the second insulating layer 22 is preferably thicker than the third electrically insulating layer 25. In particular, a second electrically insulating layer 22 having a thickness of about 500 Å is provided between the first control gate 24 and the first extension 20 and a third electrically insulating layer 25 having a thickness of about 100 Å is provided between the first control gate 24 and the second extension 26. The third electrically insulating layer 25 also preferably comprises a material having a higher dielectric constant than the second electrically insulating layer 22, as illustrated by Table 1. As will be understood by those skilled in the art, the "gate" of the memory device of FIG. 1 has the structure of metal-ferroelectric-metal-insulator-metal-insulator-semiconductor $(MF(MI)^2S)$. As described more fully hereinbelow, reading operations can be performed nondestructively on the memory device and without the addition of a select/access transistor.

Figure 2:
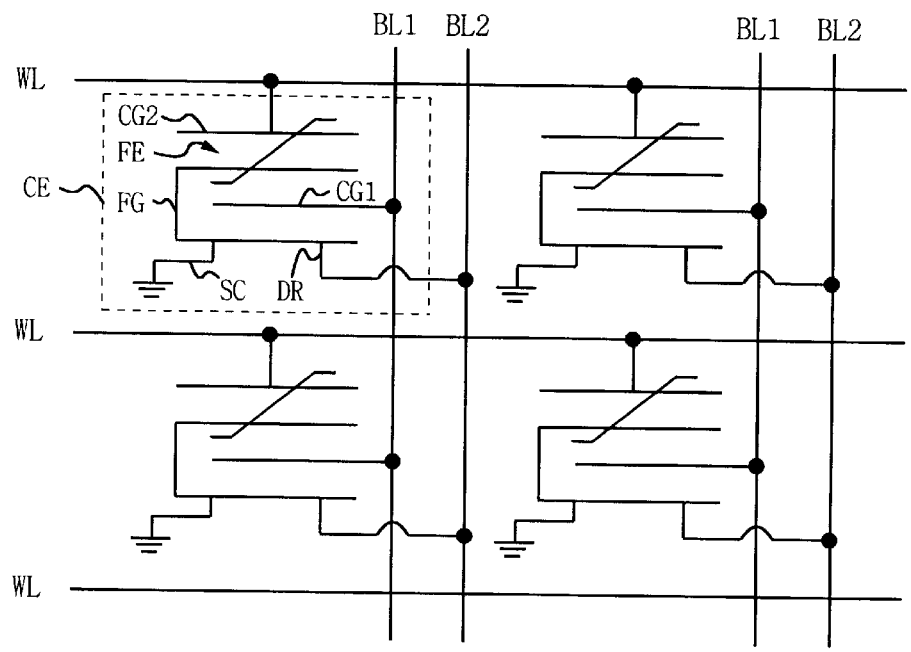
FIG. 2 is an electrical schematic of an integrated circuit memory device according to the present invention.

Referring now to FIG. 2, an electrical schematic of an integrated circuit memory device according to the present invention is provided. In particular, an integrated circuit memory device preferably includes a two-dimensional array of nonvolatile memory cells (CE) therein. The first control gates (CG1) 24 of each of the cells are preferably coupled to respective first bit lines BL1, the second control gates (CG2) 30 are preferably coupled to respective word lines WL, the drain regions (DR) 16 are preferably coupled to respective second bit lines BL2 and the source regions (SC) are preferably coupled to a reference potential (e.g., GND). The abbreviations FE and FG represent the ferroelectric insulating layer and the floating gate.

Figure 3:
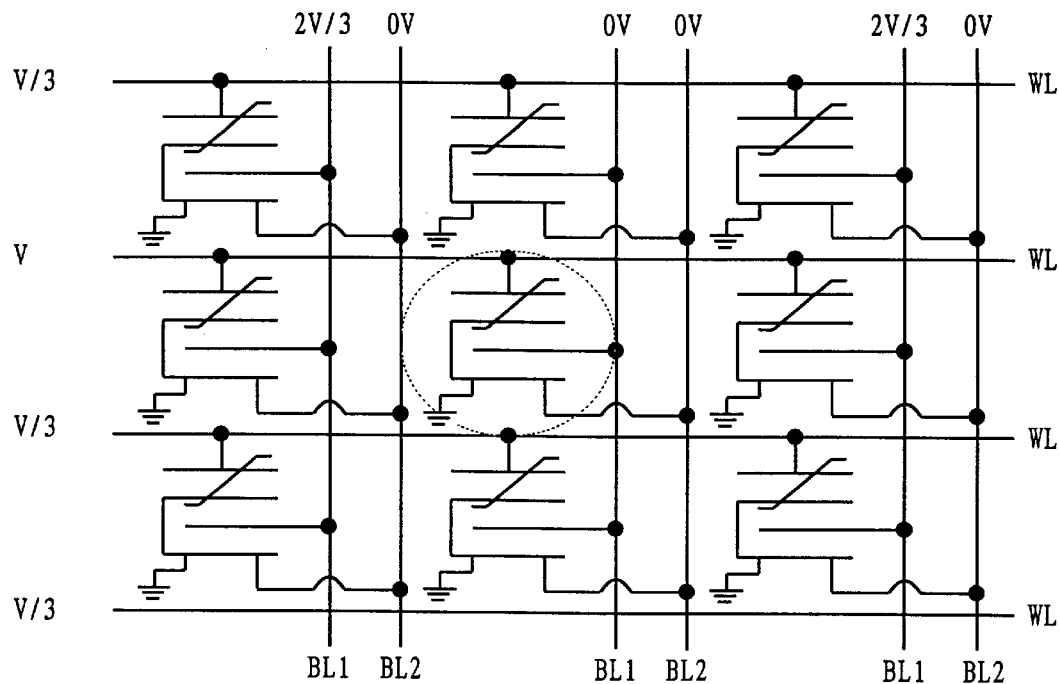
FIG. 3 is a copy of the schematic of FIG. 2 with annotations illustrating a method of writing first data (e.g., logic 1) into a preferred memory cell.

Referring now to FIG. 3, operations for writing first data (e.g., logic 1) to a selected memory cell (shown by a dotted circle) will now be described. In particular, the nonselected word lines WL are biased at potentials of V/3, the nonselected first bit lines BL1 are biased at potentials of 2V/3, the selected word line is preferably biased at a potential of V and the selected first bit line is biased at a reference potential (e.g., 0). Accordingly, the voltages appearing across the ferroelectric regions FE of the nonselected memory cells is ±V/3 and the voltage appearing across the ferroelectric region of the selected memory cell is V. The magnitude of V is preferably chosen to be sufficient to cause polarization reversal when applied across the ferroelectric insulating layer FE, but the magnitude of V/3 is insufficient to cause polarization reversal. Here, when $V_{cg2}-V_{cg1}=V$ during a writing operation, the selected memory cell can be considered as storing a logic 1 data value.

Figure 4:
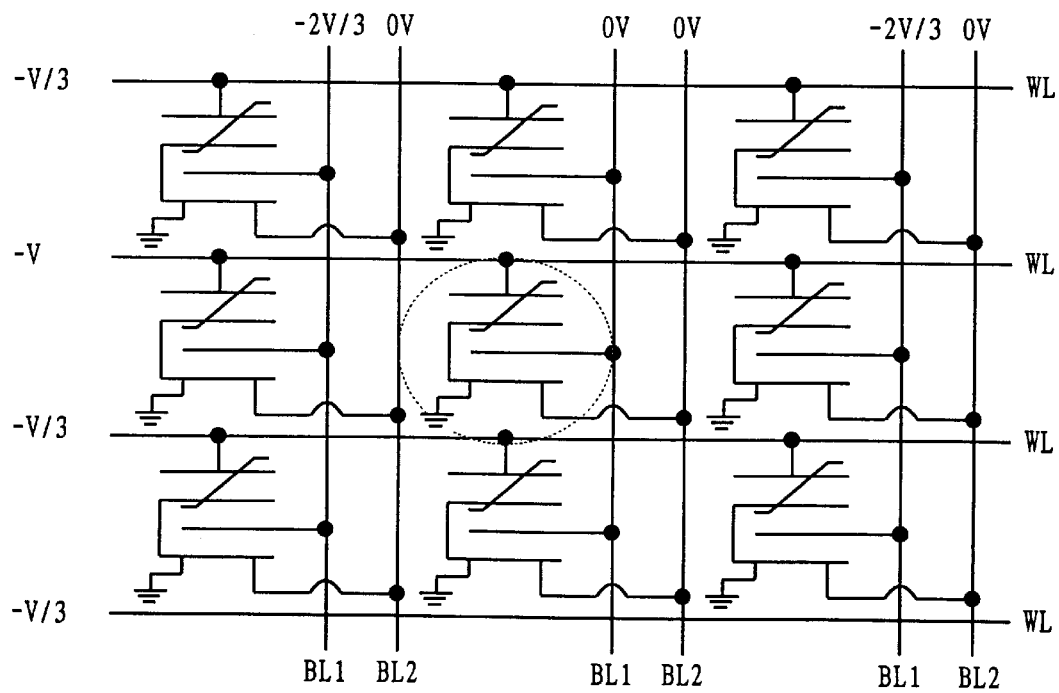
FIG. 4 is a copy of the schematic of FIG. 2 with annotations illustrating a method of writing second data (e.g., logic 0) into a preferred memory cell.

Referring now to FIG. 4, operations for writing second data (e.g., logic 0) to a selected memory cell (shown by a dotted circle) will now be described. In particular, the nonselected word lines WL are biased at potentials of -V/3, the nonselected first bit lines BL1 are biased at potentials of -2V/3, the selected word line is preferably biased at a potential of -V and the selected first bit line is biased at a reference potential (e.g., 0). Accordingly, the net voltages appearing across the ferroelectric regions FE of the nonselected memory cells is ±V/3 and the voltage appearing across the ferroelectric region of the selected memory cell is -V. The magnitude of V is preferably chosen to be sufficient to cause polarization reversal when applied across the ferroelectric insulating layer FE, but the magnitude of V/3 is insufficient to cause polarization reversal. Here, when $V_{cg2}-V_{cg1}=-V$ during a writing operation, the selected memory cell can be considered as storing a logic 0 data value.

Figure 5:
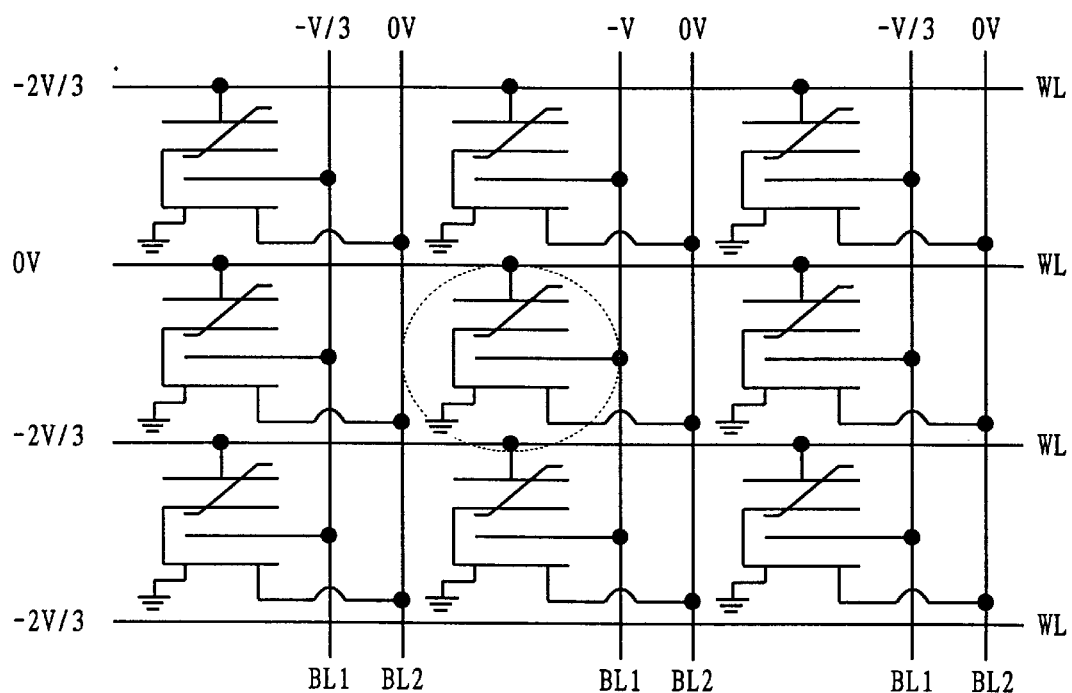
FIG. 5 is a copy of the schematic of FIG. 2 with annotations illustrating a method of writing first data (e.g., logic 1) into a preferred memory cell.

Referring now to FIG. 5, logic 1 data can also be written into the selected cell by biasing the nonselected word lines WL at potentials of -2V/3, biasing the nonselected first bit lines BL1 at potentials of -V/3, biasing the selected word line at a potential of 0 Volts and biasing the selected first bit line at -V. Accordingly, the net voltages appearing across the ferroelectric regions FE of the nonselected memory cells is ±V/3 and the voltage appearing across the ferroelectric region of the selected memory cell is V. Here, when $V_{cg2}-V_{cg1}=V$ during a writing operation, the selected memory cell can be considered as storing a logic 1 data value.

Figure 6:
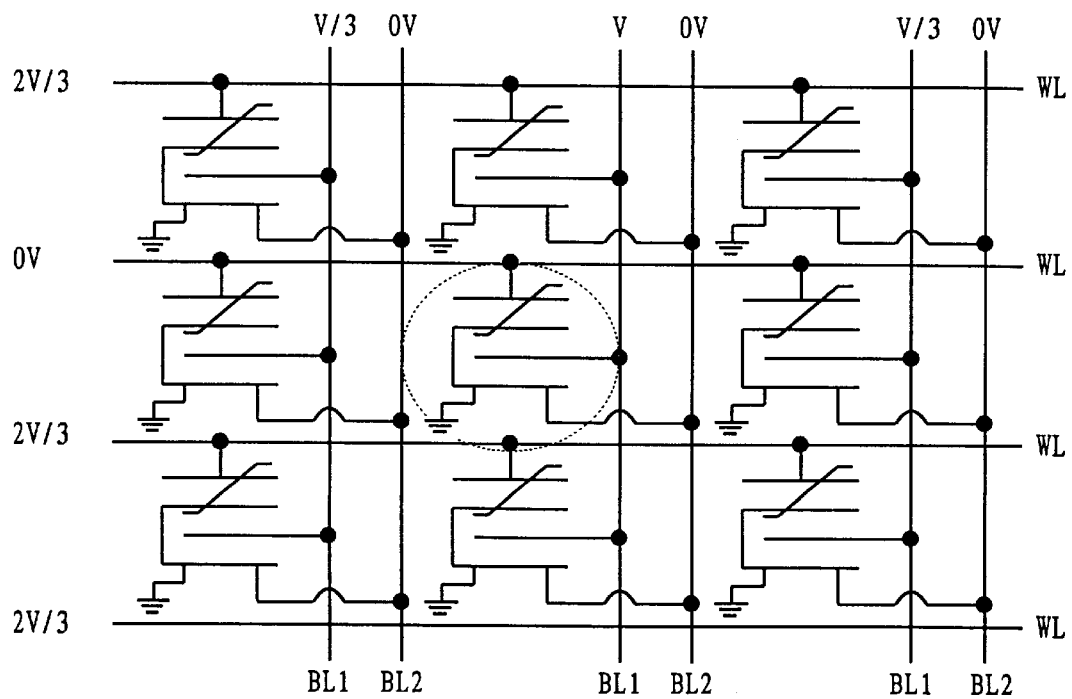
FIG. 6 is a copy of the schematic of FIG. 2 with annotations illustrating a method of writing second data (e.g., logic 0) into a preferred memory cell.

Referring now to FIG. 6, logic 0 data can also be written into the selected cell by biasing the nonselected word lines WL at potentials of 2V/3, biasing the nonselected first bit lines BL1 at potentials of V/3, biasing the selected word line at a potential of 0 Volts and biasing the selected first bit line at V. Accordingly, the net voltages appearing across the ferroelectric regions FE of the nonselected memory cells is ±V/3 and the voltage appearing across the ferroelectric region of the selected memory cell is −V. Here, when $V_{cg2}-V_{cg1}=-V$ during a writing operation, the selected memory cell can be considered as storing a logic 0 data value.

Figure 7:
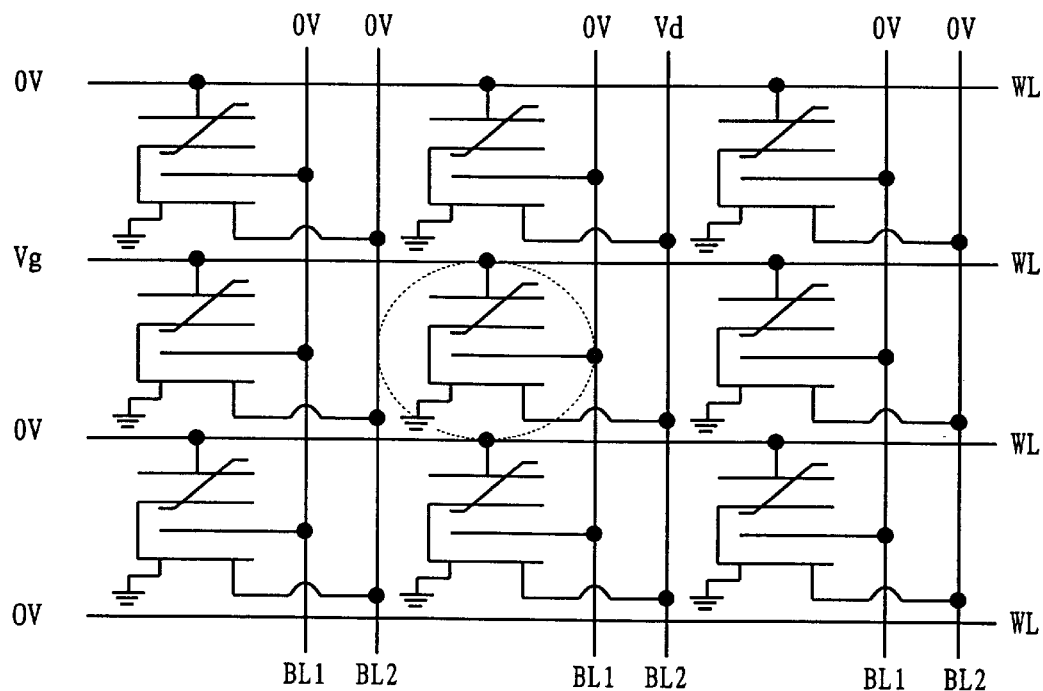
FIG. 7 is a copy of the schematic of FIG. 2 with annotations illustrating a method of reading data from a preferred memory cell.
Figure 9:
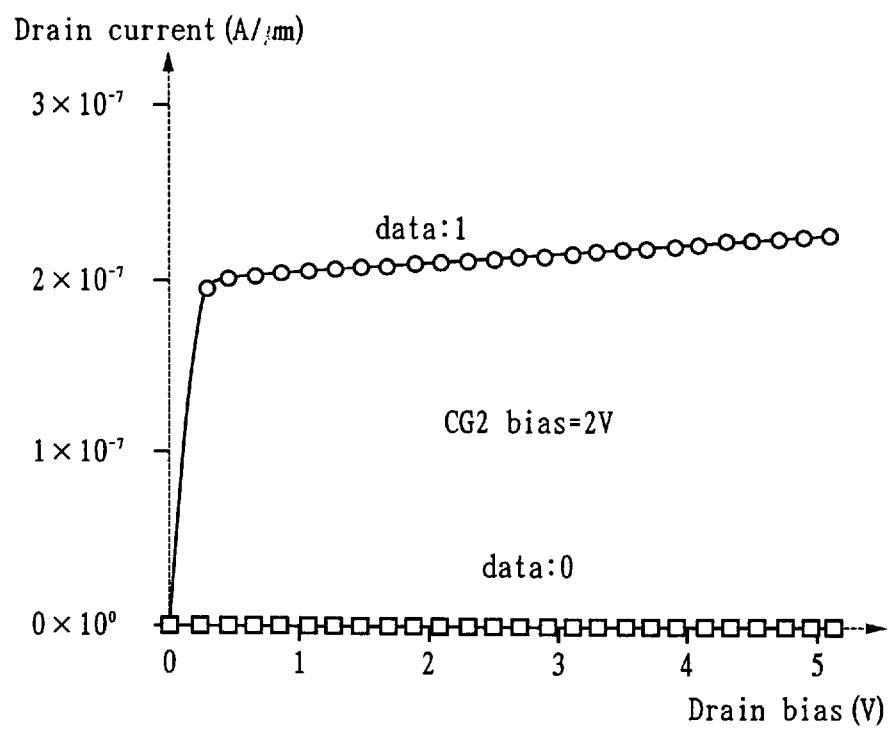
FIG. 9 is an graph illustrating a relationship between drain current and drain bias during an operation for reading the memory device of FIG. 1 when programmed with logic 1 data and logic 0 data.

Referring now to FIG. 7, the steps for performing a nondestructive read operation will now be described. In particular, the nonselected word lines and the nonselected first and second bit lines BL1 and BL2 are biased to ground, a read voltage $V_g$ is applied to the selected word line and the selected first bit line is biased to ground. The magnitude of the read voltage $V_g$ is selected at a value (e.g., 2 Volts) which is insufficient to cause polarization reversal when applied across the ferroelectric insulating layer FE. However, the magnitude of the read voltage $V_g$ is chosen to be sufficient to cause the establishment of an inversion layer channel in the channel region 14 when the ferroelectric insulating layer is storing first data (e.g., logic 1). In particular, when a read voltage is applied across the second and first control gates CG1 and CG2 and the ferroelectric insulating layer is storing first data, a portion of the read voltage $V_g$ will be transferred via capacitive coupling to the floating gate FG and this transferred voltage will induce the formation of an inversion layer channel (e.g., N-type) in the channel region 14. Accordingly, the establishment and subsequent fluctuation of a drain voltage $V_d$ on the selected second bit line BL2 can be monitored to determine (i.e., "read") the state of the selected memory cell because storage of logic 1 data therein will result in the formation of an inversion layer channel in the channel region 14 but storage of logic 0 data will not result in the formation of an inversion layer channel. Thus, as illustrated best by FIG. 9, which is a graph illustrating a relationship between drain current and drain bias during an operation for reading the memory device of FIG. 1, storage of logic 1 data will result in an elevated drain current when a read voltage $V_g$ of 2 Volts is applied to the second control gate CG2, but storage of logic 0 data will not result in an elevated drain current.

Two-dimensional simulations have been conducted on a preferred ferroelectric memory device using an ATLAS simulator manufactured by Silvaco. The structure of the memory device is the same as that of FIG. 1, and the thickness and characteristics of the layers and the polarization characteristics of the ferroelectric material are illustrated by Table 1. The doping concentrations of the silicon substrate and the source/drain regions are $3\times10^{16}$ cm$^{-3}$ and $1\times10^{20}$ cm$^{-3}$, respectively. The control and floating gates were simulated as consisting of aluminum and the second and third electrically insulating layers were simulated as oxides.

TABLE 1

| Ferroelectric layer (28) | Thickness | 2500Å |
| --- | --- | --- |
|  | Residual polarization | 6.0 μC/cm² |
|  | Saturation polarization | 8.0 μC/cm² |
|  | Constant electric field | 40 kV/cm |
|  | Dielectric constant | 150 |
| Second insulating layer (22) | Thickness | 500Å |
|  | Dielectric constant | 3.9 |
| Third insulating layer (25) | Thickness | 100Å |
|  | Dielectric constant | 80 |

TABLE 1-continued

| Floating gate electrode (20,26) | Thickness | 1000Å |
| --- | --- | --- |
| First control gate electrode (24) | Thickness | 1000Å |
| Channel (14) | Length | 5 μm |

Figure 8:
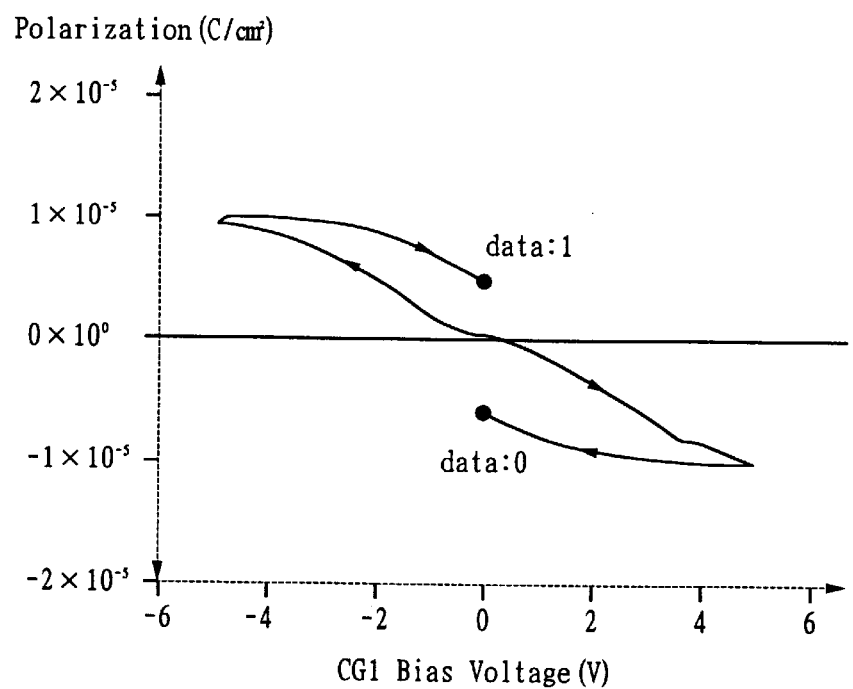
FIG. 8 is a graph showing a characteristic curve of polarization versus control gate bias for the memory device of FIG. 1.

FIG. 8 illustrates the change in polarization of the ferroelectric insulating layer which occurs when −5 Volts and 5 Volts is applied across the first and second control gates ($V_{cg1}-V_{cg2}$) to store logic 1 data and logic 0 data. In particular, when a voltage of 0 Volts is applied to the selected word line and a voltage of −5 Volts or 5 Volts is applied to the selected first bit line, spontaneous polarization of 3.4× $10^{-6}$ C/cm² and −5.5×$10^{-6}$ C/cm² takes place to store logic 1 and logic 0 data. As described above, FIG. 9 is a graph of simulated Idrain versus Vdrain when 2 Volts is applied to the selected word line. In the event a logic 1 data value has been written to establish a residual polarization of 3.4×$10^{-6}$ C/cm², an inversion layer channel will be formed in the channel region and a current of approximately 2.0×$10^{-7}$ A/μm² will be established in the channel. This current can be detected using a sense amplifier. However, when a logic 0 data value has been written, an inversion layer channel is not established. In other words, the threshold voltage of the memory device can be made to vary in accordance with the state of polarization of the ferroelectric insulating layer. Moreover, it is not necessary to include an additional select or access transistor in each unit cell to prevent inadvertent read operations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A nonvolatile memory device, comprising:
    a first electrically insulating layer on a substrate containing a semiconductor region of first conductivity type therein extending to a surface thereof;
    first and second control gates extending opposite the surface;
    a ferroelectric insulating layer disposed between said first and second control gates; and
    a floating gate having a first extension disposed between said first control gate and said first electrically insulating layer and a second extension disposed between said ferroelectric insulating layer and said first control gate.

2. The memory device of claim 1, further comprising:
    a second electrically insulating layer disposed between the first extension of said floating gate and said first control gate; and
    a third electrically insulating layer disposed between the second extension of said floating gate and said first control gate.

3. The memory device of claim 2, wherein a thickness of said second electrically insulating layer is greater than a thickness of said third electrically insulating layer.

4. The memory device of claim 3, further comprising spaced source and drain regions of second conductivity type in the region of first conductivity type, opposite ends of the first extension of said floating gate.

5. The memory device of claim 4, wherein the thickness of said second electrically insulating layer is greater than two times the thickness of said third electrically insulating layer.

6. The memory device of claim 5, wherein the thickness of said second electrically insulating layer is about 500 Å and the thickness of said third electrically insulating layer is about 100 Å.

7. The memory device of claim 1, wherein said floating gate is generally C-shaped when viewed in transverse cross-section.

8. The memory device of claim 4, wherein a dielectric constant of said third electrically insulating layer is greater than two times a dielectric constant of said second electrically insulating layer.

9. The memory device of claim 8, wherein the dielectric constant of said third electrically insulating layer is about 80 and the dielectric constant of said second electrically insulating layer is about 3.9.

10. The memory device of claim 8, wherein the dielectric constant of said third electrically insulating layer is less than a dielectric constant of said ferroelectric insulating layer.

11. The memory device of claim 10, wherein a thickness of said ferroelectric insulating layer is greater than about ten times a thickness of said third electrically insulating layer.

* * * * *